US008148251B2

(12) United States Patent
Mei (10) Patent No.: US 8,148,251 B2
(45) Date of Patent: Apr. 3, 2012

(54) FORMING A SEMICONDUCTOR DEVICE (75) Inventor: Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 925 days.

(21) Appl. No.: 10/769,127

(22) Filed: Jan. 30, 2004

(65) Prior Publication Data

US 2005/0170639 A1 Aug. 4, 2005

(51) Int. Cl.
H01L 21/44 (2006.01)
(52) U.S. Cl. .................. 438/600; 438/131; 257/E21.35
(58) Field of Classification Search .................. 438/778, 438/780, 669, 706, 735, 597, 624, 638, 700, 438/622, 636–637, 675, 738, 740, 131, 600, 438/601; 257/E21.35
See application file for complete search history.

(56) References Cited

U.S. PATENT DOCUMENTS

| | | | |
|---|---|---|---|
| 5,772,905 A | 6/1998 | Chou | |
| 5,877,076 A * | 3/1999 | Dai | 438/597 |
| 6,586,327 B2 | 7/2003 | Shepard | |
| 6,664,174 B2 * | 12/2003 | Ema et al. | 438/601 |
| 6,861,365 B2 * | 3/2005 | Taussig et al. | 438/725 |
| 6,977,108 B2 | 12/2005 | Hieda et al. | |
| 7,147,790 B2 * | 12/2006 | Wachenschwanz et al. | 216/22 |
| 7,482,207 B2 * | 1/2009 | Brown et al. | 438/149 |
| 2002/0136927 A1 | 9/2002 | Hieda et al. | |
| 2003/0034329 A1 | 2/2003 | Chou | |
| 2003/0205657 A1 | 11/2003 | Voisin | |
| 2004/0002216 A1 | 1/2004 | Taussig et al. | |
| 2004/0008334 A1 | 1/2004 | Sreenivasan et al. | |
| 2004/0023162 A1 * | 2/2004 | Hasegawa et al. | 430/320 |
| 2004/0101713 A1 * | 5/2004 | Wachenschwanz et al. | 428/694 SG |
| 2007/0184251 A1 * | 8/2007 | Chikagawa | 428/210 |

FOREIGN PATENT DOCUMENTS

| | | |
|---|---|---|
| EP | 1376663 A3 | 4/2005 |
| JP | 11-317346 A | 11/1999 |
| JP | 2002-224327 A | 8/2002 |
| JP | 2002-258457 A | 11/2002 |
| JP | 2002543582 T | 12/2002 |
| JP | 2003-007977 A | 1/2003 |
| JP | 2003-115574 A | 4/2003 |
| JP | 2004006643 A | 1/2004 |
| WO | WO0065408 | 11/2000 |
| WO | 02027768 A3 | 4/2002 |

OTHER PUBLICATIONS

Japanese Office Action for Japanese Patent Application 2005-020698. Aug. 3, 2010. (English Translation).
Chinese Office Action for Chinese Patent Application 2005-10006706. Jul. 13, 2007. (English Translation).

(Continued)

Primary Examiner — Quoc Hoang (57) ABSTRACT

The present invention includes a method and system for forming a semiconductor device. Varying embodiments generate 2 dimensional alignment features in a device by implementing a 3-dimensional pattern into an underlying device substrate. Accordingly, alignments between successive device patterning steps can be determined regardless of the dilations or contractions that can take place during the device fabrication process. A first aspect of the present invention is a method for forming a semiconductor device. The method includes forming a 3-dimensional pattern in a substrate and depositing at least one material over the substrate in accordance with desired characteristics of the semiconductor device.

29 Claims, 9 Drawing Sheets

OTHER PUBLICATIONS

Japanese Office Action for Japanese Patent Application 2005-020698. Apr. 15, 2011. (English Translation).
Japanese Office Action for Japanese Patent Application 2005-020698. Feb. 26, 2008. (and English Translation).
Taiwanese Office Action for Taiwanese Patent Application 93122384. May 23, 2011. (English Translation).
Japanese Office Action for Japanese Patent Application 2005-020698. Feb. 17, 2009. (and English Translation).
Great Britain Office Action for Great Britain Patent Application 0501735.5. Feb. 2, 2007.
Great Britain Office Action for Great Britain Patent Application 0501735.5. Jul. 19, 2007.

* cited by examiner

FORMING A SEMICONDUCTOR DEVICE

FIELD OF THE INVENTION

The present invention relates generally to the field of semiconductor devices and more particularly to a method and system for forming a semiconductor device.

BACKGROUND OF THE INVENTION

In the semiconductor processing industry, there is currently a strong trend toward scaling down existing structures and fabricating smaller structures. This process is commonly referred to as microfabrication. One area in which microfabrication has had a significant impact is in the microelectronic area. In particular, the scaling down of microelectronic structures has generally allowed the structures to be less expensive, have higher performance, exhibit reduced power consumption, and contain more components for a given dimension. Although microfabrication has been widely active in the electronics industry, it has also been applied to other applications such as biotechnology, optics, mechanical systems, sensing devices and reactors.

Typically the fabrication of an electronic device requires several deposition and etching steps that often must be aligned with each other with a degree of accuracy approaching or even exceeding the minimum feature size of the device. Currently, electronic devices are fabricated on flat, inflexible, non-deformable substrates such as crystalline Si or glass using photolithography. However, a much more inexpensive means for producing such devices is based on imprint lithography.

Imprint lithography is typically utilized to pattern thin films on a substrate material with high resolution using contact between a master with the features of the structure to be fabricated and the substrate material to be patterned. The thin films patterned can be dielectrics, semiconductors, metals or organic and can be patterned as thin films or individual layers. Imprint lithography is particularly useful in roll-to-roll processing since it has a higher throughput and can handle wider substrates.

In conventional photolithography, optical alignment marks are used to guarantee alignment between successive patterning steps. Although, it is possible to use optical alignment marks in a roll-to-roll process it is not practical for several reasons. First, it adds additional complexity since the fundamental imprint lithography process is not optical. Next, the lack of planarity of the substrate in a roll-to-roll environment causes difficulties in the accuracy with which optical alignments can be made due to depth of field restrictions and other optical aberrations. Finally, the flexible substrates used in roll-to-roll processing may experience dimensional changes due to variations in temperature, humidity, or mechanical stress. These deformations and/or dilations of one patterned layer with respect to the next may make accurate alignments over a large area impossible.

Accordingly, what is needed is a method and system for fabricating a device that overcomes the above referenced problems related to the roll-to-roll fabrication process. The method and system should be simple, inexpensive and capable of being easily adapted to existing technology. The present invention addresses these needs.

SUMMARY OF THE INVENTION

An aspect of the present invention is a method for forming a semiconductor device. The method includes forming a 3-dimensional (3D) pattern in a substrate and depositing at least one material over the substrate in accordance with desired characteristics of the semiconductor device.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 5(*a*)-5(*e*) show side perspective views of the resulting structure of the process of FIG. 5.

DETAILED DESCRIPTION

The present invention relates to a method and system for forming a semiconductor device. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a method and system for forming a semiconductor device is disclosed. Varying embodiments of the method and system allow 2-dimensional alignment features to be created in 3D structures on a device substrate prior to any processing steps. Subsequent processing steps, including material deposition, planarization and anisotropic etching are utilized to construct a multi-level aligned pattern. Accordingly, the use of the method and system can potentially increase the flexibility of the semiconductor manufacturing process.

Although the disclosed embodiments are described as being utilized to form a semiconductor device, one of ordinary skill in the art will readily recognize that other types of devices, for example, mechanical, optical, biological, etc.

Figure 1:
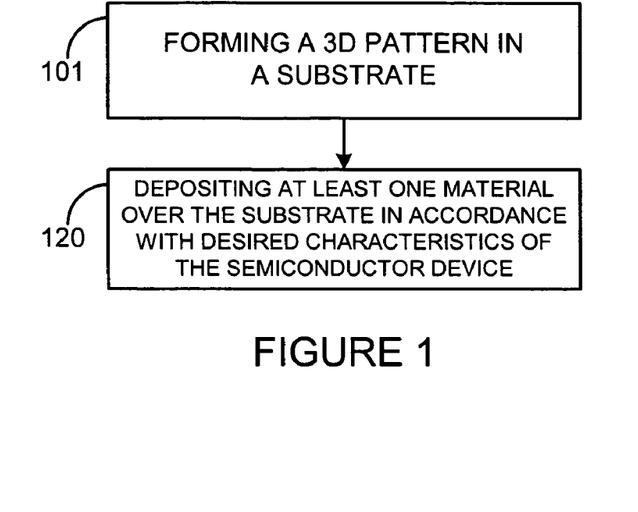
FIG. 1 is a high-level flow chart of a method in accordance with an embodiment of the present invention.

FIG. 1 is a high level flow chart of a method of forming a semiconductor device. A first step 110 includes forming a 3-dimensional (3D) pattern in a substrate. In an embodiment, the substrate is a flexible substrate adequate for use in a roll-to-roll process. A final step 120 includes depositing at least one material over the substrate in accordance with desired characteristics of the semiconductor device. Consequently, whereas in a direct imprinting process, where the aspect ratio of the features is limited by the material properties of an imprinting tool, the proposed formation of a 3D pattern in a substrate relaxes the constraint on the aspect ratio of the 3D features. The proposed method is particularly useful in the formation of cross-point memory arrays.

Figure 2:
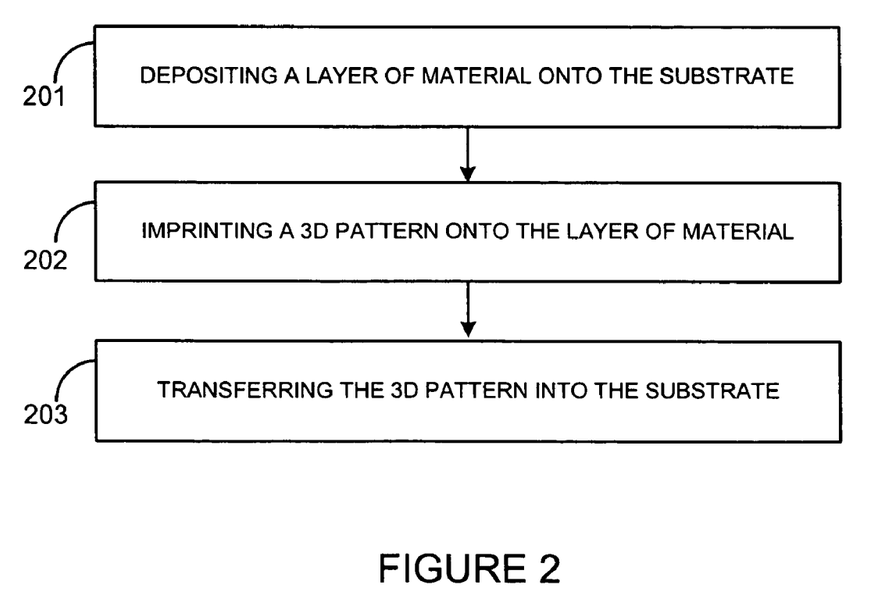
FIG. 2 is a flowchart of a process for forming a 3D pattern into a substrate in accordance with an embodiment of the present invention.

In an embodiment, step 110 is accomplished by transferring a 3D pattern into a substrate. FIG. 2 is a flowchart of a process for transferring a 3D pattern into a substrate. A first step 201 includes depositing a layer of material onto the substrate. In an embodiment, the layer of material is a polymer material such as a polymer from the Norland optical adhesives (NOA) family of polymers. In an alternate embodiment, the layer of material is a photo-resist material. A second step 202 includes imprinting a 3D pattern into the layer of material. A final step 203 includes transferring the 3D pattern into the substrate.

In an embodiment, step 202 is accomplished by utilizing a stamping tool wherein the stamping tool includes a 3D pattern. Accordingly, the stamping tool is brought into contact with the layer of material thereby imprinting the 3D pattern into the layer of material. A method for utilizing a stamping tool to generate a 3D pattern in a layer of material is described in a patent application Ser. No. 10/184,587 entitled "A Method and System for Forming a Semiconductor Device" which is herein incorporated by reference.

Figure 3:
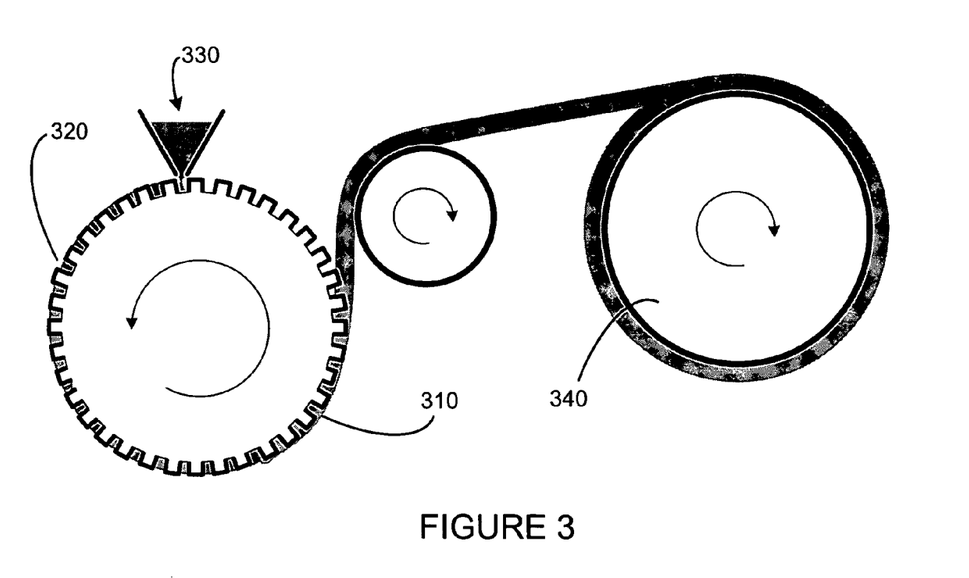
FIG. 3 shows a configuration in accordance with an alternate embodiment of the present invention.

Alternatively, the 3D pattern can be formed in the substrate via a molding process. FIG. 3 shows a configuration in accordance with an alternate embodiment. The configuration includes a mold drum 310 wherein the mold drum 310 includes a doctor blade 320 and a release drum 340. Accordingly, a liquid compound of polyimide precursor 330 is filled into the mold drum 310, thermally cured and released from the mold drum 310 onto the release drum 340.

Figure 4:
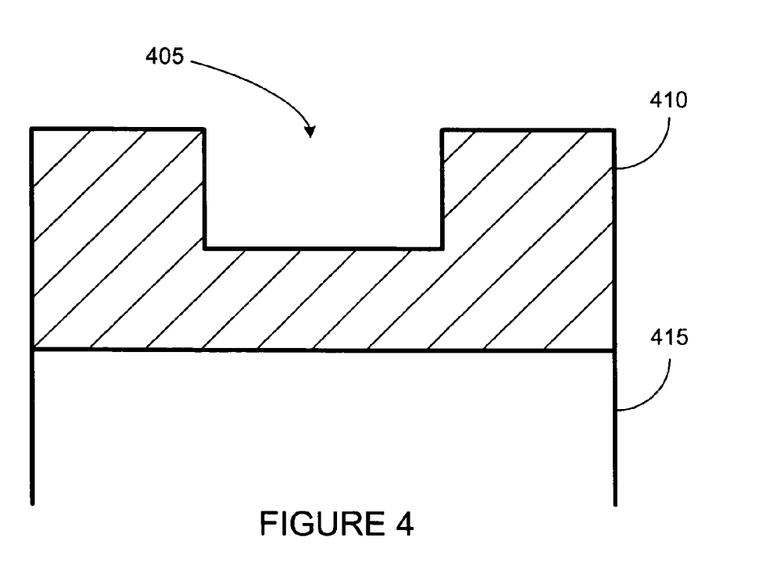
FIG. 4 shows a side perspective view of a structure in accordance with an embodiment of the present invention.

FIG. 4 shows a side perspective view of a structure in accordance with an embodiment. As can be seen in FIG. 4, the layer of material 410 includes the 3D pattern 405 and is in contact with the substrate 415. The substrate 415 can be polymide plastic sheet with or without inorganic coating on a plastic substrate. Preferably, the substrate 415 should be able to sustain a temperature of at least 160° C.

Figure 5:
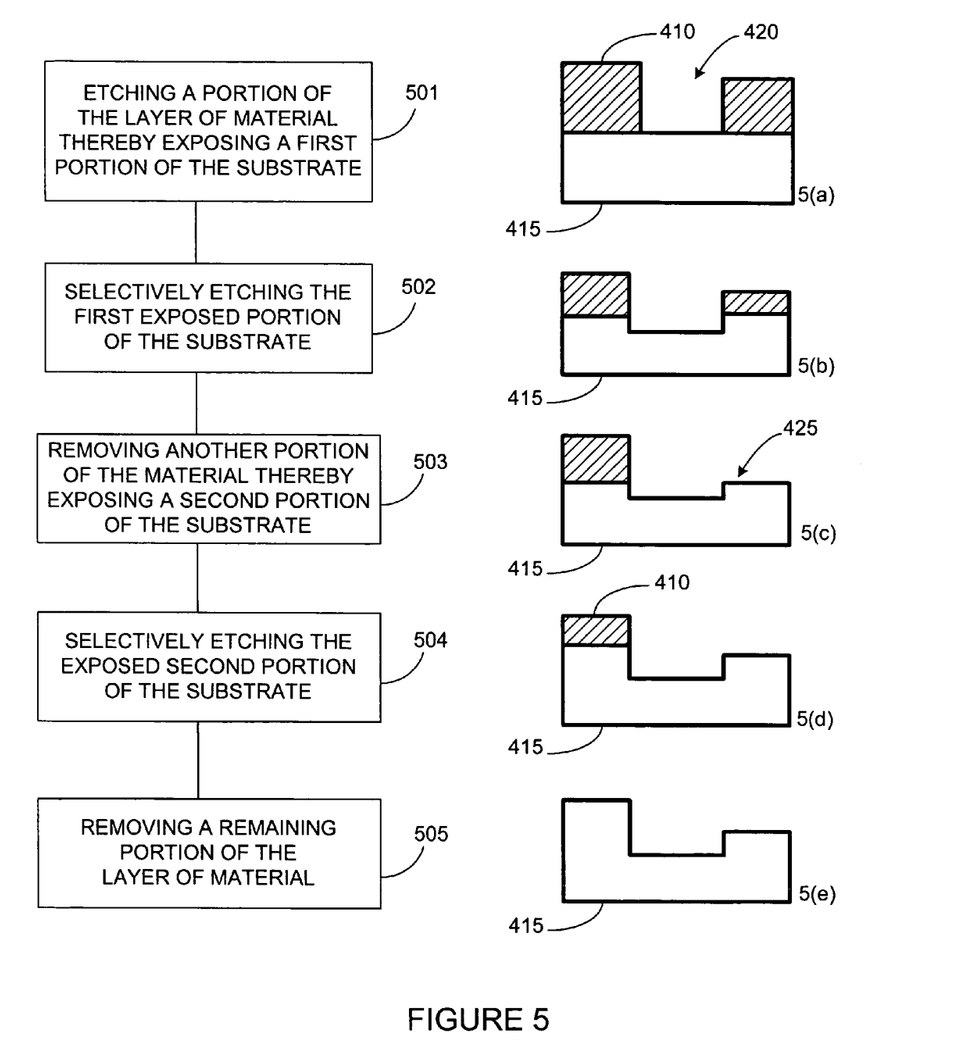
FIG. 5 is a flowchart of a process for forming a 3D pattern in accordance with an embodiment of the present invention.

Once the 3D pattern is imprinted on the layer of material, the 3D pattern is transferred into the substrate by a sequence of thinning and substrate etching steps. FIG. 5 is a flowchart of a process for forming a 3D pattern into a substrate. A first step 501 includes etching a portion of the layer of material thereby exposing a first portion of the substrate. FIG. 5(a) shows a side perspective view of the layer of material 410 and the first exposed portion 420 of the substrate 415.

A second step 502 includes selectively etching the exposed portion of the substrate. Here, the etch characteristics of the substrate are such that the substrate is removed at a faster rate than the polymer layer. FIG. 5(b) shows the structure after the substrate 415 has been selectively etched.

A third step 503 involves removing another portion of the material thereby exposing a second portion of the substrate. FIG. 5(c) shows the exposed second portion 425 of the substrate 415.

A fourth step 504 involves selectively etching the exposed portion of the substrate. Again, this step is accomplished because the etch characteristics of the substrate are such that the substrate is removed at a faster rate than the layer of material. FIG. 5(d) shows the structure after the substrate 415 has been selectively etched again. A remaining portion of the layer of material 410 can also be seen in FIG. 5(d).

A final step 505 includes removing a remaining portion of the layer of material. FIG. 5(e) shows the substrate 415 after removing the remaining portion of the layer of material.

Once the 3D pattern is transferred to the substrate the patterned substrate can be implemented in the formation of a variety of semiconductor devices. Accordingly, the patterned substrate is particularly useful in the formation of cross-point memory arrays.

Cross-Point Arrays

Preferably, the cross-point memory array includes two layers of orthogonal sets of spaced parallel conductors arranged with a semiconductor layer there between. The two sets of conductors form row and column electrodes overlaid in such a manner that each of the row electrodes intersects each of the column electrodes at exactly one place.

Figure 6:
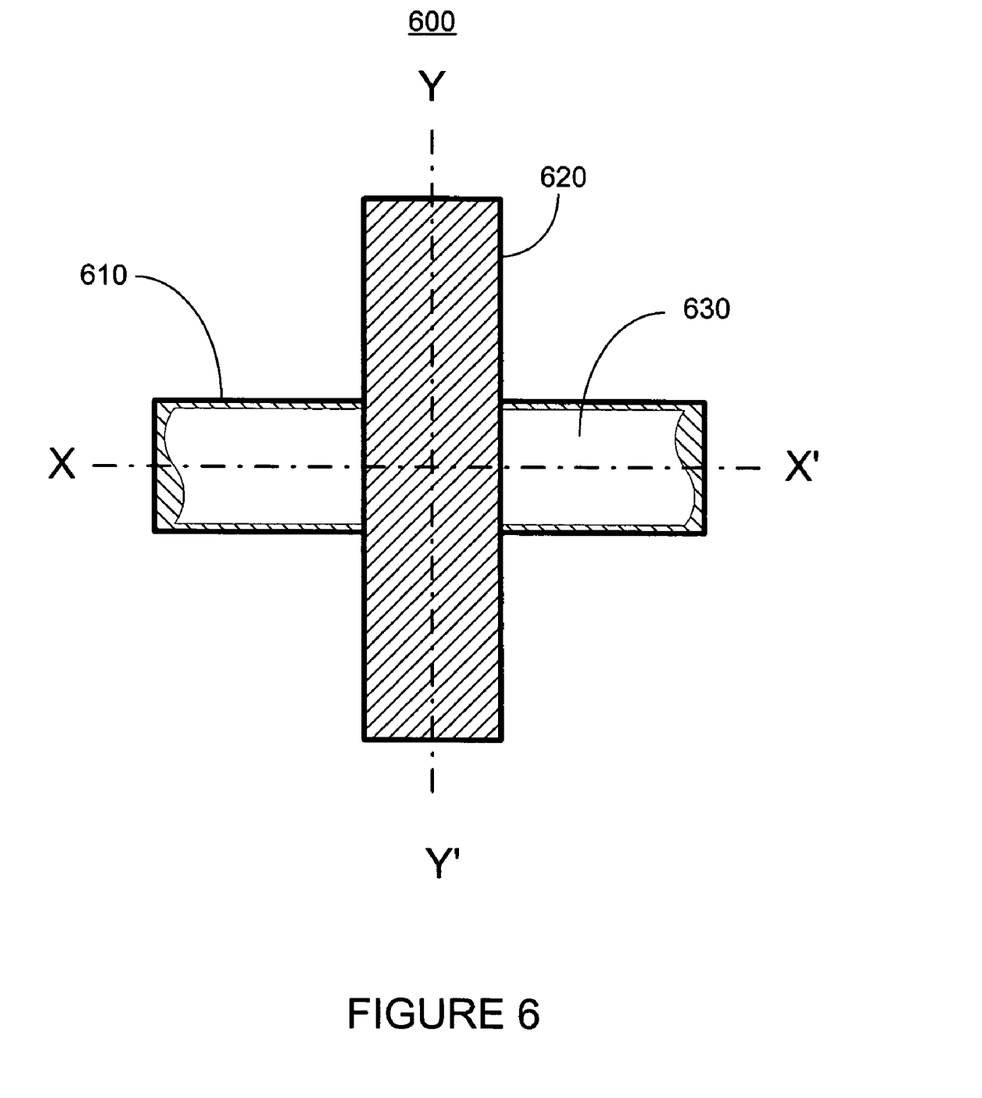
FIG. 6 is an illustration of a cross-point array configuration in accordance with an embodiment of the present invention.

For a more detailed understanding of a cross-point array, please refer now to FIG. 6. FIG. 6 is an illustration of a cross-point array configuration 600. At each of the intersections, a connection is made between the row electrode 610 and column electrode 620 through a semiconductor layer 630 which acts in the manner of a diode and a fuse in series. The diodes in the array are all oriented so that if a common potential is applied between all the row electrodes and all the column electrodes then all the diodes will be biased in the same direction. The fuse element may be realized as a separate element that will open-circuit when a critical current is passed there through or it may be incorporated in the behavior of the diode.

One of ordinary skill in the art will readily recognize that the above-described cross-point arrays could be utilized in the formation of a variety of semiconductor devices including but not limited to, transistors, resistors, capacitors, diodes, fuses, anti-fuses, etc.

Figure 7:
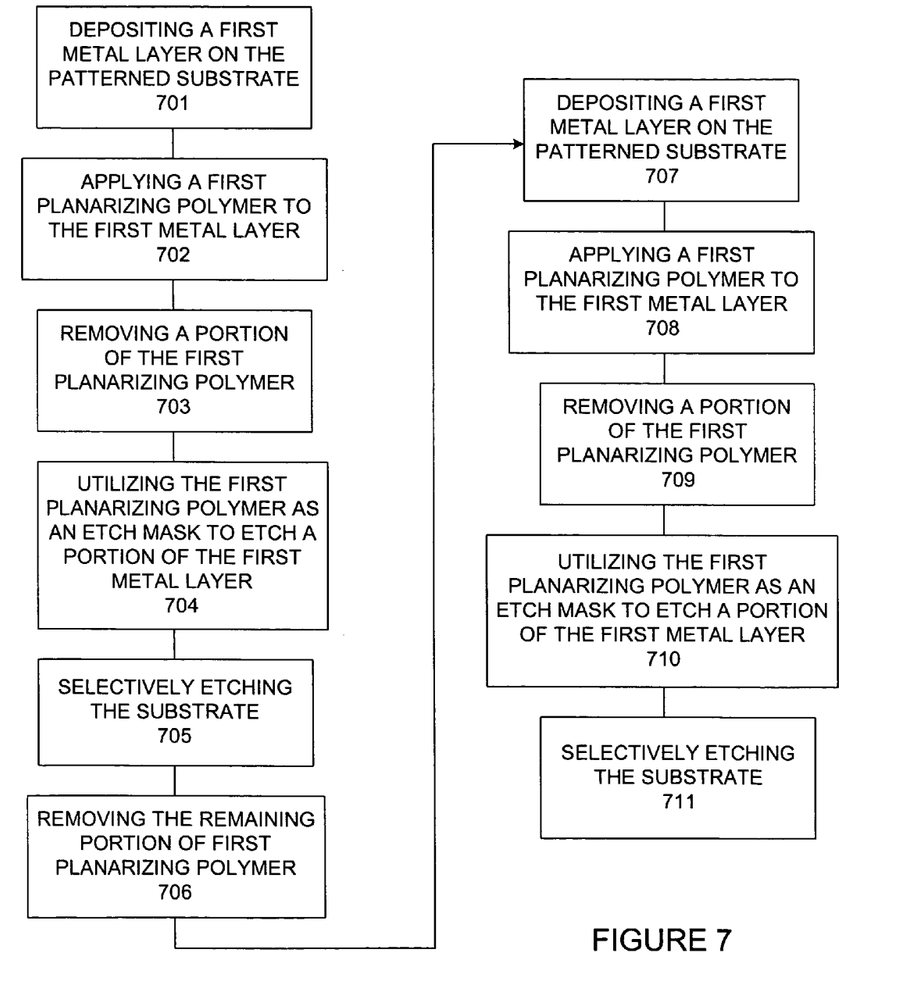
FIG. 7 shows a process for forming a cross-point array in accordance with an embodiment of the present invention.
Figure 8:
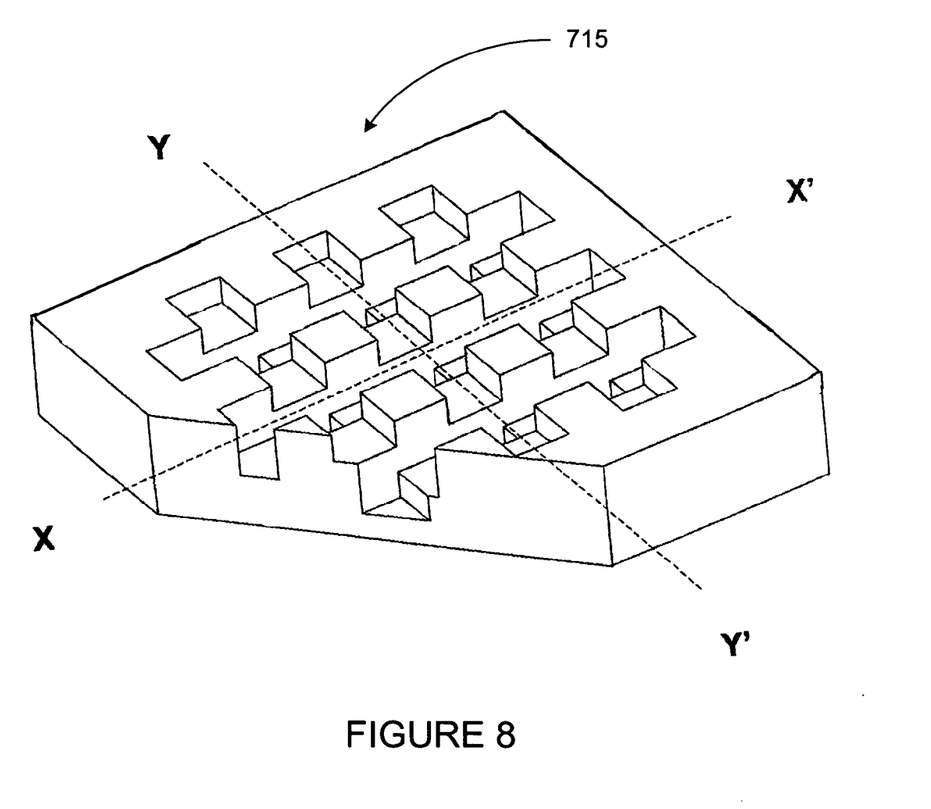
FIG. 8 shows a substrate that includes a three dimensional pattern formed therein in accordance with an embodiment of the present invention.
Figure 9:
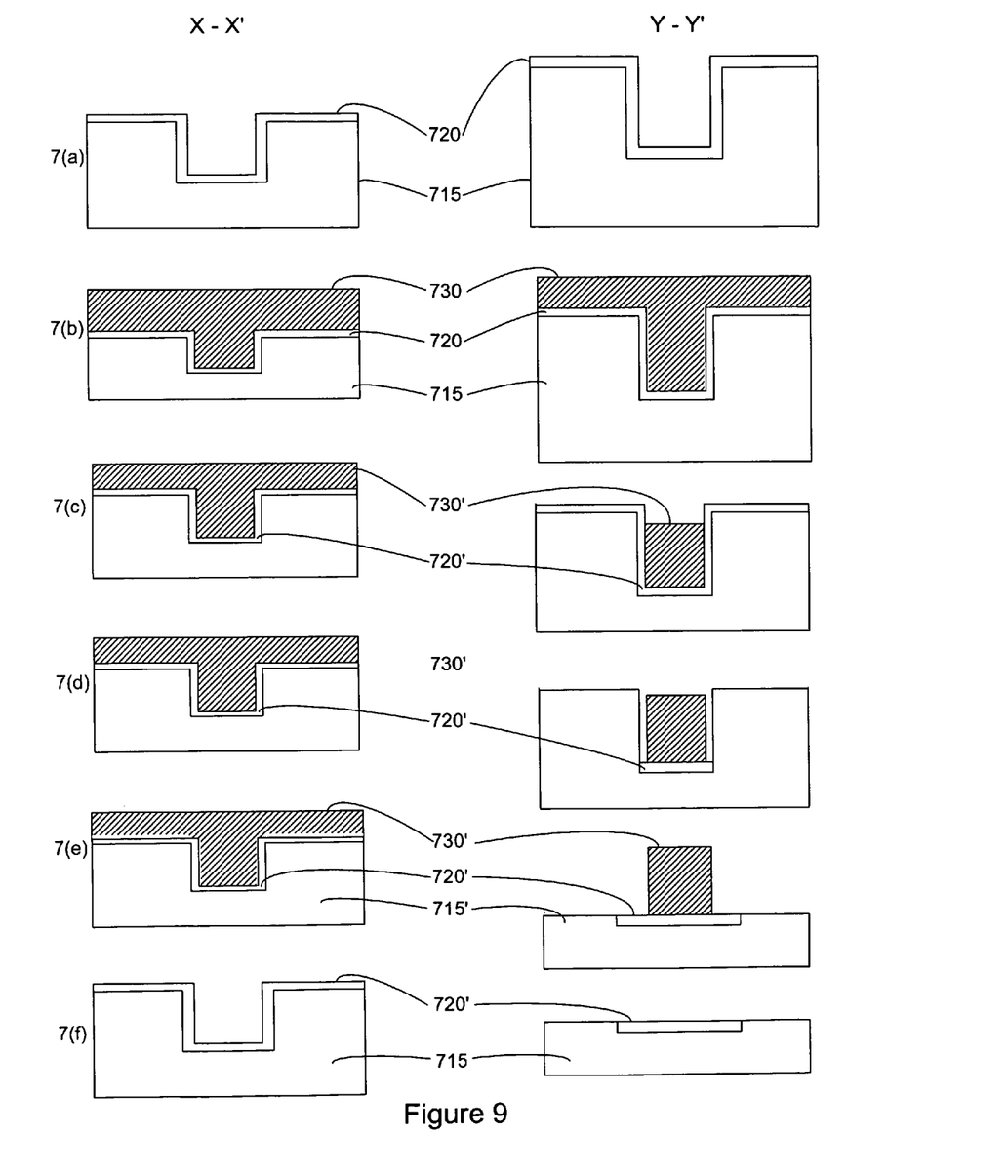
FIGS. 9 and 10 show cross-sections X-X' and Y-Y' of the resulting structure during the implementation of the process of FIG. 7 in accordance with an embodiment of the present invention.
Figure 10:
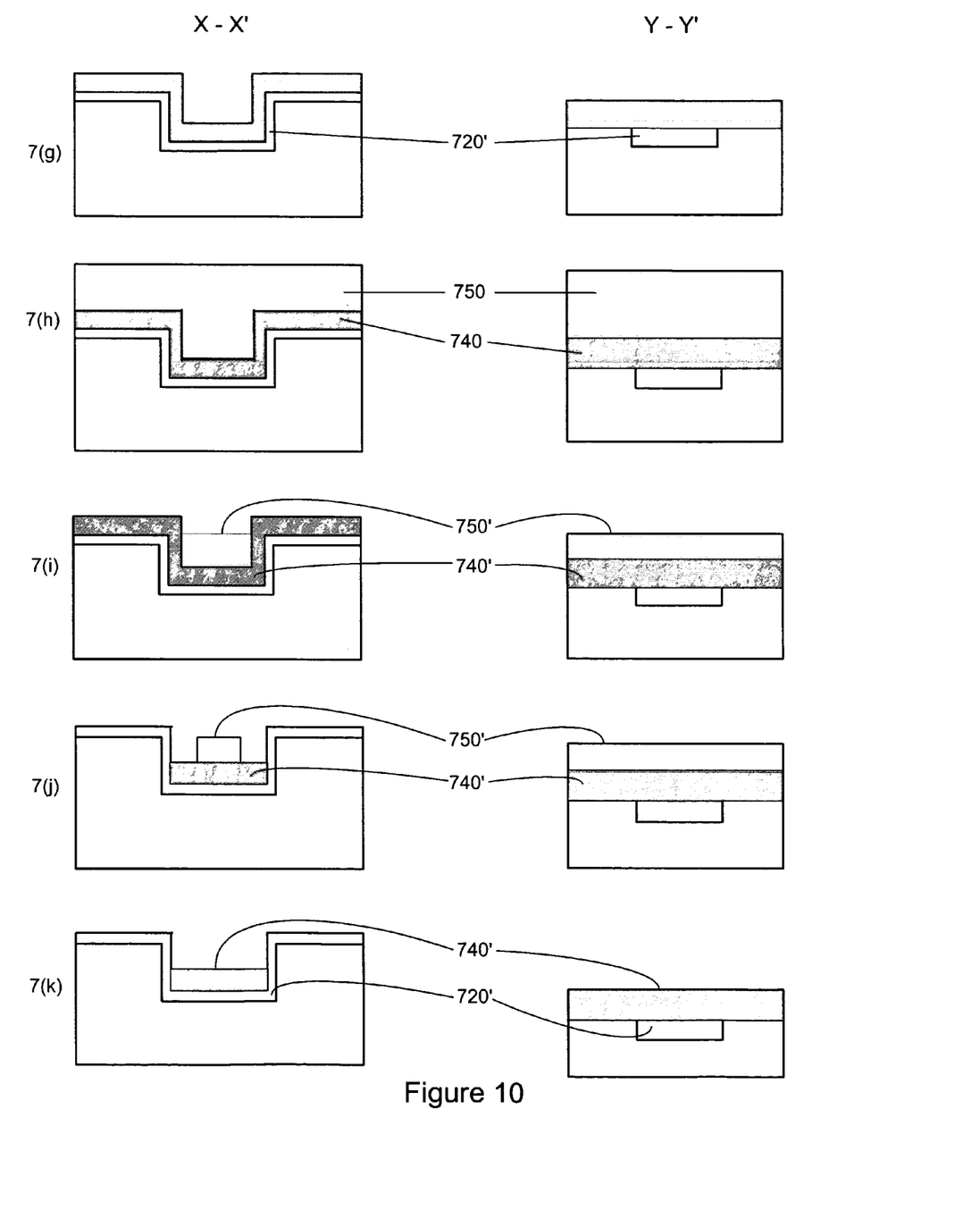

FIG. 7 shows a process for forming a cross-point array in accordance with an embodiment. For illustrative purposes, FIG. 8 shows a substrate 715 that includes a three dimensional pattern formed therein. FIGS. 9-10 show cross-sections X-X' and Y-Y' of the resulting structure during the implementation of the process of FIG. 7.

A first step 701 involves depositing a first metal layer on the patterned substrate. FIG. 7(a) shows a structure that includes the first metal layer 720 on the patterned substrate 715. In an embodiment, the first metal layer 720 is one or more layers of metals, organics, dielectrics or semiconductors. If the deposition is highly directional, a tapered sidewall profile is needed for the patterned substrate 715 in order for the first metal layer 720 to have good step coverage.

A second step 702 involves applying a first planarizing polymer to the first metal layer. FIG. 7(b) shows the first planarizing polymer 730 in contact with the first metal layer 720. Examples of planarization polymers are photo-resist, uv-curable polymers and spin-on glass.

A third step 703 includes removing a portion of the first planarizing polymer. FIG. 7(c) shows the structure that includes a remaining portion of the first planarization polymer 730'. In an embodiment, the first planarization polymer is removed by a reactive ion etching (RIE) process whereby the etching is selective with respect to the first metal layer.

In RIE, the substrate is placed inside a reactor in which several gases are introduced. A plasma is struck in the gas mixture using an RF power source, breaking the gas molecules into ions. The ions are accelerated towards, and reacts at, the surface of the material being etched, forming another gaseous material. This is known as the chemical part of reactive ion etching. There is also a physical portion which is similar in nature to the sputtering deposition process.

If the ions have high enough energy, they can knock atoms out of the material to be etched without a chemical reaction. It is a very complex task to develop dry etch processes that balance chemical and physical etching, since there are many parameters to adjust. By changing the balance it is possible to influence the anisotropy of the etching, since the chemical part is isotropic and the physical part is highly anisotropic. Accordingly, RIE is capable of performing a very directional etch.

A fourth step 704 includes utilizing the first planarizing polymer as an etch mask to etch a portion of the first metal layer. FIG. 7(d) shows the structure after a portion of the first metal layer has been removed. As can be seen, a remaining portion of the first planarization polymer 730' is left along with a remaining portion of the first metal layer 720'. In an embodiment, this etching step has the selectivity to remove the first metal layer but not the first planarization polymer or the substrate.

A fifth step 705 includes selectively etching the substrate. FIG. 7(e) shows the structure after the substrate 715 has been selectively etched. Again, this etching step is selective in that the remaining portion of the first planarization polymer 730' and the remaining portion of the first metal layer 720' remain on the substrate 715.

A sixth step 706 includes removing the remaining portion of the first planarizing polymer. FIG. 7(f) shows the structure after the remaining portion of the planarizing polymer has been removed. As can be seen, only the remaining portion of the first metal layer 720' is left of the substrate 715.

The process continues on FIG. 8. A next step 707 involves depositing a second metal over the remaining portion of the first metal layer. FIG. 7(g) shows the structure after a second metal layer 740 is deposited on the remaining portion of the first metal layer 720'. Similar the first metal layer, the second metal layer 740 is one or more layers of metals, organics, dielectrics or semiconductors.

A next step 708 includes applying a second planarization polymer to the second metal layer. FIG. 7(h) shows the structure after the deposition of the second planarization polymer 750. This polymer can be the same type as the first planarization polymer or a different polymer can be utilized.

A next step 709 includes removing a portion of the second planarizing polymer thereby exposing a portion of the second metal layer. FIG. 7(i) shows the structure that includes a remaining portion of the second planarization polymer 750' and the exposed portion of the second metal layer 740'. In an embodiment, the second planarization polymer is removed by a reactive ion etching (RIE) process whereby the etching is selective with respect to the second metal layer.

A next step 710 includes utilizing the second planarizing polymer as an etch mask to etch a portion of the second metal layer. FIG. 7(j) shows the structure after a portion of the second metal layer has been removed. As can be seen, a remaining portion of the second planarization polymer 750' is left along with a remaining portion of the second metal layer 740'. In an embodiment, this etching step has the selectivity to remove the second metal layer but not the second planarization polymer or the substrate.

A final step 711 includes removing the remaining portion of the second planarization polymer. FIG. 7(k) shows the structure after the remaining portion of the second planarizing polymer has been removed. Again, the cross-point memory array includes two layers of orthogonal sets of spaced parallel conductors arranged with a semiconductor layer there between. The two sets of conductors form row and column electrodes overlaid in such a manner that each of the row electrodes intersects each of the column electrodes at exactly one place.

Figure 11:
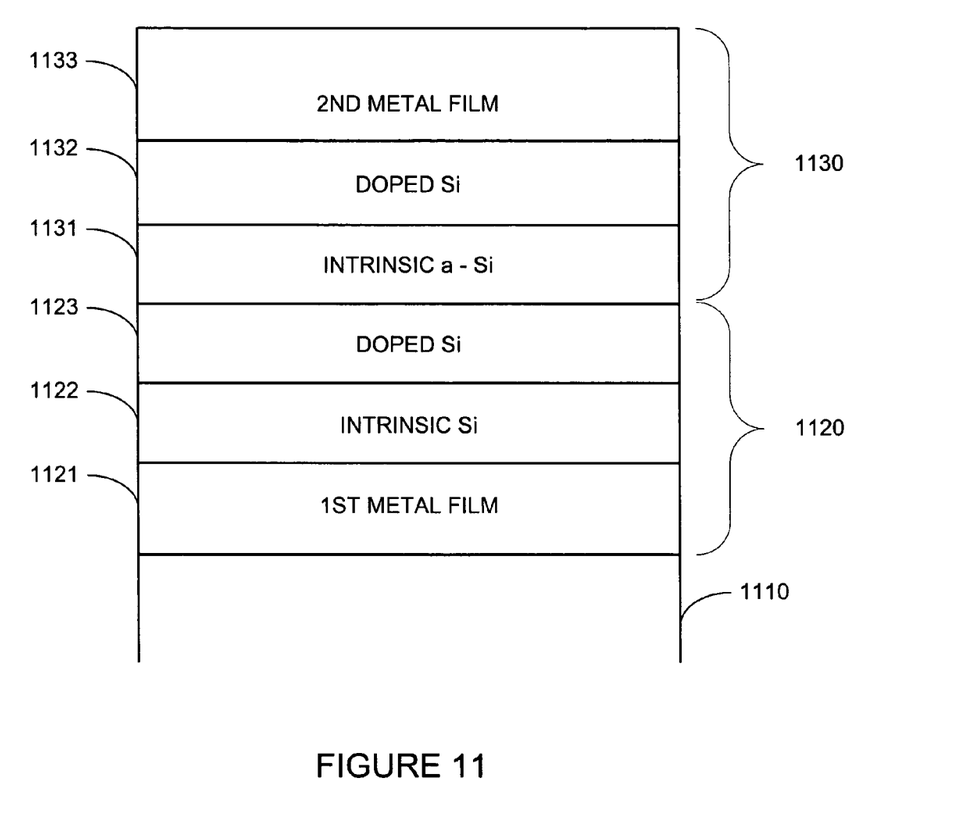
FIG. 11 shows an exemplary cross-point structure in accordance with an embodiment of the present invention.

In an exemplary embodiment, the first metal layer includes a metal film, a layer of intrinsic Si and a doped Si. The second metal layer includes a layer of intrinsic a-Si, a doped Si and a metal film. FIG. 11 shows an exemplary cross-point structure 1100. The structure 1100 includes a first metal layer 1120 and a second metal layer 1130 on a substrate 1110. The first metal layer 1120 includes a metal film 1121, a layer of intrinsic Si 1122 and a doped Si 1123. The second metal layer 1130 includes a layer of intrinsic a-Si 1131, a doped Si 1132 and a second metal film 1133. Consequently, the cross-point 1100 is an anti-fuse memory switch in connection with an a-Si diode.

A method and system for forming a semiconductor device is disclosed. Varying embodiments of the method and system allow 2-dimensional alignment features to be created in 3D structures on a device substrate prior to any processing steps. Subsequent processing steps, including material deposition, planarization and anisotropic etching are utilized to construct a multi-level aligned pattern. Accordingly, the use of the method and system can potentially increase the flexibility of the semiconductor manufacturing process.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed:

1. A method for forming a semiconductor device comprising:
    forming a 3-dimensional (3D) pattern in a substrate by,
        depositing a layer of material onto the substrate;
        imprinting a 3D pattern into the layer of material; and
        transferring the 3D pattern into the substrate; and
    depositing at least one material over the substrate in accordance with desired characteristics of the semiconductor device,
    wherein the semiconductor device comprises a cross-point memory array.

2. The method of claim 1 wherein the semiconductor device is at least one of a transistor, a resistor, a capacitor, a diode, a fuse and an anti-fuse.

3. The method of claim 1 wherein imprinting a 3D pattern into the layer of material further comprises utilizing a 3D stamping tool to create the 3D pattern.

4. The method of claim 1 wherein imprinting a 3D pattern into the layer of material further comprises utilizing a molding process to imprint the 3D pattern into the layer of material.

5. The method of claim 1 wherein the layer of material comprises a polymer material.

6. The method of claim 1 wherein the layer of material comprises a photo-resist material.

7. The method of claim 1 wherein transferring the 3D pattern into the substrate includes:
    removing a portion of the layer of material thereby exposing a portion of the substrate;
    etching the exposed portion of the substrate;
    removing another portion of the layer of material thereby exposing a second portion of the substrate;
    etching the second portion of the substrate; and
    removing a remaining portion of the layer of material.

8. The method of claim 7 wherein depositing at least one material over the substrate further comprises:
- depositing a first metal layer on the substrate;
- applying a first planarizing polymer to the metal layer;
- removing a portion of the first planarizing polymer;
- utilizing the first planarizing polymer as an etch mask to etch the first metal layer thereby leaving a remaining portion of the first metal layer;
- etching the substrate in a selective fashion; and
- removing the first planarizing polymer.

9. The method of claim 8 wherein depositing at least one material over the substrate further comprises:
- depositing a second metal layer on the remaining portion of the first metal layer;
- applying a second planarizing polymer to the second metal layer;
- removing a portion of the second planarizing polymer;
- utilizing the second planarizing polymer as an etch mask to etch the second metal layer; and
- removing the second planarizing polymer.

10. The method of claim 1 wherein depositing at least one material over the substrate further comprises:
- depositing two sets of conductors with a semiconductor layer there between to form row and column electrodes overlaid in such a manner that each of the row electrodes intersects each of the column electrodes at exactly one place.

11. A system for forming a semiconductor device comprising:
- means for forming a pattern in a substrate wherein the pattern is 3-dimensional, wherein the means for forming the pattern further comprises:
  - means for depositing a layer of material onto the substrate;
  - means for imprinting a 3D pattern onto the layer of material; and
  - means for transferring the 3D pattern into the substrate; and
- means for depositing at least one semiconductor material over the substrate in accordance with desired characteristics of the semiconductor device,
- wherein the semiconductor device comprises a cross-point memory array.

12. The system of claim 11 wherein the means for depositing at least one semiconductor material over the substrate further comprises:
- means for depositing two sets of conductors with a semiconductor layer there between to form row and column electrodes overlaid in such a manner that each of the row electrodes intersects each of the column electrodes at exactly one place.

13. The system of claim 11 wherein the semiconductor device is at least one of a transistor, a resistor, a capacitor, a diode, a fuse and an anti-fuse.

14. The system of claim 11 wherein the means for imprinting a 3D pattern into the layer of material further comprises means for implementing a molding process to imprint the 3D pattern into the layer of material.

15. The system of claim 11 wherein the means for transferring the 3D pattern into the substrate includes:
- means for removing a portion of the layer of material thereby exposing a portion of the substrate;
- means for etching the exposed portion of the substrate;
- means for removing another portion of the layer of material thereby exposing a second portion of the substrate;
- means for etching the second portion of the substrate; and
- means for removing a remaining portion of the layer of material.

16. The system of claim 11 wherein the means for imprinting a 3D pattern onto the layer of material further comprises means for utilizing a 3D stamping tool to create the 3D pattern.

17. The system of claim 11 wherein the means for depositing at least one semiconductor material over the substrate further comprises:
- means for depositing a first metal layer;
- means for applying a planarizing polymer to the first metal layer;
- means for removing a portion of the planarizing polymer;
- means for utilizing the planarizing polymer as an etch mask to etch the first metal layer thereby leaving a remaining portion of the first metal layer;
- means for etching the substrate in a selective fashion; and
- means for removing the planarizing polymer.

18. The system of claim 17 wherein the means for depositing at least one semiconductor material over the substrate further comprises:
- means for depositing a second metal layer on the remaining portion of the first metal layer;
- means for applying a second planarizing polymer to the second metal layer;
- means for removing a portion of the second planarizing polymer;
- means for utilizing the second planarizing polymer as an etch mask to etch the second metal layer; and
- means for removing the second planarizing polymer.

19. The system of claim 11 wherein the layer of material comprises a polymer material.

20. The system of claim 11 wherein the layer of material comprises a photo-resist material.

21. A method for forming a semiconductor device comprising:
- forming a 3-dimensional (3D) pattern in a substrate by,
  - depositing a layer of material onto the substrate;
  - imprinting a 3D pattern into the layer of material; and
  - transferring the 3D pattern into the substrate;
- depositing a first metal layer on the substrate;
- applying a first planarizing polymer to the metal layer;
- removing a portion of the first planarizing polymer;
- utilizing the first planarizing polymer as an etch mask to etch the first metal layer thereby leaving a remaining portion of the first metal layer;
- etching the substrate in a selective fashion; and
- removing the first planarizing polymer.

22. The method of claim 21 wherein the semiconductor device comprises a cross-point memory array.

23. The method of claim 21 further comprising:
- depositing a second metal layer on the remaining portion of the first metal layer;
- applying a second planarizing polymer to the second metal layer;
- removing a portion of the second planarizing polymer;
- utilizing the second planarizing polymer as an etch mask to etch the second metal layer; and
- removing the second planarizing polymer.

24. The semiconductor device of claim 21 wherein transferring the 3D pattern into the substrate includes:
- removing a portion of the layer of material thereby exposing a portion of the substrate;
- etching the exposed portion of the substrate;
- removing another portion of the layer of material thereby exposing a second portion of the substrate;
- etching the second portion of the substrate; and
- removing a remaining portion of the layer of material.

25. A method for forming a semiconductor device comprising:
forming a 3-dimensional (3D) pattern in a substrate by,
depositing a layer of material onto the substrate, wherein the substrate comprises a polyimide material;
imprinting a 3D pattern into the layer of material without imprinting the 3D pattern into the substrate; and
transferring the 3D pattern into the substrate; and
depositing at least one material over the substrate in accordance with desired characteristics of the semiconductor device.

26. The method of claim 25 wherein the semiconductor device comprises a cross-point memory array.

27. The method of claim 25 wherein imprinting a 3D pattern into the layer of material further comprises utilizing one of a 3D stamping tool to create the 3D pattern and a molding process to imprint the 3D pattern into the layer of material.

28. The method of claim 25 wherein transferring the 3D pattern into the substrate includes:
removing a portion of the layer of material thereby exposing a portion of the substrate;
etching the exposed portion of the substrate;
removing another portion of the layer of material thereby exposing a second portion of the substrate;
etching the second portion of the substrate; and
removing a remaining portion of the layer of material.

29. The method of claim 25 wherein depositing at least one material over the substrate further comprises:
depositing two sets of conductors with a semiconductor layer there between to form row and column electrodes overlaid in such a manner that each of the row electrodes intersects each of the column electrodes at exactly one place.

* * * * *